(12) United States Patent
Bertness

(10) Patent No.: US 6,316,914 B1
(45) Date of Patent: *Nov. 13, 2001

(54) TESTING PARALLEL STRINGS OF STORAGE BATTERIES

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/662,401

(22) Filed: Sep. 14, 2000

Related U.S. Application Data

(63) Continuation-in-part of application No. 09/564,740, filed on May 4, 2000.
(60) Provisional application No. 60/132,622, filed on May 5, 1999, provisional application No. 60/165,208, filed on Nov. 12, 1999, and provisional application No. 60/175,762, filed on Jan. 12, 2000.

(51) Int. Cl.[7] ............................. H02J 7/00; G01N 27/416
(52) U.S. Cl. ............................................. 320/134; 324/430
(58) Field of Search ...................................... 320/134, 116, 320/119; 324/426, 430; 702/63

(56) References Cited

U.S. PATENT DOCUMENTS

| 2,514,745 | 7/1950 | Dalzell | 171/95 |
| 3,356,936 | 12/1967 | Smith | 324/29.5 |

(List continued on next page.)

FOREIGN PATENT DOCUMENTS

| 0 022 450 A1 | 1/1981 | (EP) . |
| 29 26 716 B1 | 1/1981 | (DE) . |
| 0 637 754 A1 | 2/1995 | (EP) . |

(List continued on next page.)

OTHER PUBLICATIONS

"Electrochemical Impedance Spectroscopy in Battery Development and Testing", *Batteries International*, Apr. 1997, pp. 59 and 62–63.
"Battery Impedance", by E. Willihnganz et al., *Electrical Engineering*, Sep. 1959, pp. 922–925.
"Determining The End of Battery Life", by S. DeBardelaben, *IEEE*, 1986, pp. 365–368.

(List continued on next page.)

*Primary Examiner*—Gregory J Toatley, Jr.
(74) *Attorney, Agent, or Firm*—Westman, Champlin & Kelly, P.A.

(57) ABSTRACT

An apparatus is provided for testing a first storage battery in a bank of storage batteries, the bank formed of at least two storage batteries electrically coupled together. The apparatus includes a first Kelvin connection configured to couple to the bank of storage batteries, the first Kelvin connection including a first and second electrical connection and a second Kelvin connection configured to couple to the bank of storage batteries, the second Kelvin connection including a first and a second electrical connection, the first and second Kelvin connections configured to couple across at least the first battery. A time varying forcing function source is configured to apply a forcing function between the first electrical connection of the first Kelvin connection and the first electrical connection of the second Kelvin connection. A voltage sensor is configured to sense a voltage between the second electrical connection of the first Kelvin connection and the second electrical connection of the second Kelvin connection and provide a sensed voltage output which is at least partially a function of the forcing function. A current sensor senses an electrical current in the bank of storage batteries related to the first battery and provides a sensed current output which is at least partially a function of the forcing function. A microprocessor determines a condition of the first battery as a function of the sensed voltage and the sensed current.

32 Claims, 3 Drawing Sheets

U.S. PATENT DOCUMENTS

| | | | |
|---|---|---|---|
| 3,562,634 | 2/1971 | Latner | 31/4 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/29.5 |
| 3,876,931 | 4/1975 | Godshalk | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 3,989,544 | 11/1976 | Santo | 429/65 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,217,645 | 8/1980 | Barry et al. | 364/483 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,379,990 | 4/1983 | Sievers et al. | 322/99 |
| 4,390,828 | 6/1983 | Converse et al. | 320/32 |
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,633,418 | 12/1986 | Bishop | 364/554 |
| 4,659,977 | 4/1987 | Kissel et al. | 320/64 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,745,349 | 5/1988 | Palanisamy et al. | 320/22 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,876,495 | 10/1989 | Palanisamy et al. | 320/18 |
| 4,881,038 | 11/1989 | Champlin | 324/426 |
| 4,912,416 | 3/1990 | Champlin | 324/430 |
| 4,913,116 | 4/1990 | Katogi et al. | 123/425 |
| 4,929,931 | 5/1990 | McCuen | 340/636 |
| 4,931,738 | 6/1990 | MacIntyre et al. | 324/435 |
| 4,937,528 | 6/1990 | Palanisamy | 324/430 |
| 4,947,124 | 8/1990 | Hauser | 324/430 |
| 4,956,597 | 9/1990 | Heavey et al. | 320/14 |
| 4,968,941 | 11/1990 | Rogers | 324/428 |
| 4,968,942 | 11/1990 | Palanisamy | 324/430 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,218 | 9/1992 | Bosscha | 320/44 |
| 5,144,248 | 9/1992 | Alexandres et al. | 324/428 |
| 5,160,881 | 11/1992 | Schramm et al. | 322/7 |
| 5,170,124 | 12/1992 | Blair et al. | 324/434 |
| 5,179,335 | 1/1993 | Nor | 320/21 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,266,880 | 11/1993 | Newland | 320/14 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,315,287 | 5/1994 | Sol | 340/455 |
| 5,321,626 | 6/1994 | Palladino | 364/483 |
| 5,331,268 | 7/1994 | Patino et al. | 320/20 |
| 5,336,993 | 8/1994 | Thomas et al. | 324/158.1 |
| 5,338,515 | 8/1994 | Dalla Betta et al. | 422/95 |
| 5,339,018 | 8/1994 | Brokaw | 320/35 |
| 5,343,380 | 8/1994 | Champlin | 363/46 |
| 5,347,163 | 9/1994 | Yoshimura | 307/66 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,412,323 | 5/1995 | Kato et al. | 324/429 |
| 5,426,371 | 6/1995 | Salley et al. | 324/429 |
| 5,426,416 | 6/1995 | Jefferies et al. | 340/664 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,451,881 | 9/1995 | Finger | 324/433 |
| 5,457,377 | 10/1995 | Jonsson | 320/5 |
| 5,469,043 | 11/1995 | Cherng et al. | 320/31 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,537,967 | 7/1996 | Tashiro et al. | 123/792.1 |
| 5,546,317 | 8/1996 | Andrieu | 364/481 |
| 5,548,273 | 8/1996 | Nicol et al. | 340/439 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,583,416 | 12/1996 | Klang | 320/22 |
| 5,585,728 | 12/1996 | Champlin | 324/427 |
| 5,589,757 | 12/1996 | Klang | 320/22 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |

| | | | |
|---|---|---|---|
| 5,602,462 | 2/1997 | Stich et al. ............................ 323/258 |
| 5,606,242 | 2/1997 | Hull et al. ............................... 320/48 |
| 5,621,298 | 4/1997 | Harvey ..................................... 320/5 |
| 5,642,031 | 6/1997 | Brotto ..................................... 320/21 |
| 5,650,937 | 7/1997 | Bounaga ............................... 364/483 |
| 5,652,501 | 7/1997 | McClure et al. ....................... 320/17 |
| 5,656,920 | 8/1997 | Cherng et al. ......................... 320/31 |
| 5,675,234 | 10/1997 | Greene .................................. 320/15 |
| 5,677,077 | 10/1997 | Faulk ..................................... 429/90 |
| 5,699,050 | 12/1997 | Kanazawa ............................ 340/636 |
| 5,701,089 | 12/1997 | Perkins ................................ 327/772 |
| 5,705,929 | 1/1998 | Caravello et al. .................... 324/430 |
| 5,710,503 | 1/1998 | Sideris et al. ............................ 320/6 |
| 5,717,336 | 2/1998 | Basell et al. ......................... 324/430 |
| 5,717,937 | 2/1998 | Fritz ................................. 395/750.01 |
| 5,747,909 | 5/1998 | Syverson et al. .................... 310/156 |
| 5,757,192 | 5/1998 | McShane et al. .................... 324/427 |
| 5,760,587 | 6/1998 | Harvey ................................. 324/434 |
| 5,773,978 | 6/1998 | Becker .................................. 324/430 |
| 5,789,899 | 8/1998 | van Phuoc et al. .................... 320/30 |
| 5,793,359 | 8/1998 | Ushikubo ............................. 345/169 |
| 5,808,469 | 9/1998 | Kopera ................................ 324/43.4 |
| 5,821,756 | 10/1998 | McShane et al. .................... 324/430 |
| 5,825,174 | 10/1998 | Parker ................................... 324/106 |
| 5,831,435 | 11/1998 | Troy ..................................... 324/426 |
| 5,862,515 | 1/1999 | Kobayashi et al. .................... 702/63 |
| 5,872,443 | 2/1999 | Williamson ............................ 320/21 |
| 5,895,440 | 4/1999 | Proctor et al. .......................... 702/63 |
| 5,914,605 | 6/1999 | Bertness .............................. 324/430 |
| 5,929,609 | 7/1999 | Joy et al. ............................... 322/25 |
| 5,939,855 | 8/1999 | Proctor et al. ........................ 320/104 |
| 5,939,861 * | 8/1999 | Joko et al. ............................ 320/122 |
| 5,945,829 | 8/1999 | Bertness .............................. 324/430 |
| 5,969,625 | 10/1999 | Russo ................................... 340/636 |
| 6,002,238 | 12/1999 | Champlin ............................. 320/134 |
| 6,008,652 | 12/1999 | Theofanopoulos et al. ......... 324/434 |
| 6,009,369 | 12/1999 | Boisvert et al. ........................ 701/99 |
| 6,031,354 | 2/2000 | Wiley et al. ........................... 320/116 |
| 6,037,751 | 3/2000 | Klang ................................... 320/160 |
| 6,037,777 | 3/2000 | Champlin ............................. 324/430 |
| 6,051,976 | 4/2000 | Bertness .............................. 324/426 |
| 6,072,299 | 6/2000 | Kurie et al. ............................ 320/112 |
| 6,072,300 | 6/2000 | Tsuji ...................................... 320/116 |
| 6,081,098 | 6/2000 | Bertness et al. ..................... 320/134 |
| 6,091,245 | 7/2000 | Bertness .............................. 324/426 |
| 6,094,033 | 7/2000 | Ding et al. ............................. 320/132 |
| 6,104,167 | 8/2000 | Bertness et al. ..................... 320/132 |
| 6,114,834 | 9/2000 | Parise ................................... 320/109 |
| 6,137,269 | 10/2000 | Champlin ............................. 320/150 |
| 6,150,793 | 11/2000 | Lesesky et al. ...................... 320/104 |
| 6,163,156 | 12/2000 | Bertness .............................. 324/426 |
| 6,172,483 | 1/2001 | Champlin ............................. 320/134 |
| 6,172,505 | 1/2001 | Bertness .............................. 324/430 |

FOREIGN PATENT DOCUMENTS

| | | |
|---|---|---|
| 0 772 056 A1 | 5/1997 | (EP) . |
| 2 749 397 | 12/1997 | (FR) . |
| 2 088 159 A | 6/1982 | (GB) . |
| 59-17892 | 1/1984 | (JP) . |
| 59-17893 | 1/1984 | (JP) . |
| 59-17894 | 1/1984 | (JP) . |
| 59017894 | 1/1984 | (JP) . |
| 59215674 | 12/1984 | (JP) . |
| 60225078 | 11/1985 | (JP) . |
| 62-180284 | 8/1987 | (JP) . |
| 63027776 | 2/1988 | (JP) . |
| 03274479 | 12/1991 | (JP) . |
| 03282276 | 12/1991 | (JP) . |
| 4-8636 | 1/1992 | (JP) . |
| 04131779 | 5/1992 | (JP) . |
| 04372536 | 12/1992 | (JP) . |
| 5216550 | 8/1993 | (JP) . |
| 7-128414 | 5/1995 | (JP) . |
| WO 93/22666 | 11/1993 | (WO) . |
| WO 98/58270 | 12/1998 | (WO) . |

OTHER PUBLICATIONS

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std*. 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

* cited by examiner

TESTING PARALLEL STRINGS OF STORAGE BATTERIES

This application is a continuation-in-part application of U.S. Ser. No. 09/564,740, filed May 4, 2000, and entitled ENERGY MANAGEMENT SYSTEM FOR AUTOMOTIVE VEHICLE, which claims priority to Provisional Application Ser. No. 60/132,622, filed May 5, 1999, and entitled AUTOMOTIVE VEHICLE BATTERY CHARGING SYSTEM; U.S. Provisional Application No. 60/165,208, filed Nov. 12, 1999, and entitled ENERGY MANAGEMENT SYSTEM FOR AUTOMOTIVE VEHICLE; and Provisional Application Ser. No. 60/175,762, filed Jan. 12, 2000, and entitled ENERGY MANAGEMENT SYSTEM FOR AUTOMOTIVE VEHICLE.

BACKGROUND OF THE INVENTION

The present invention relates to electronic battery testers. More specifically, the present invention relates to a technique for determining the condition of a battery electrically connected in a bank of storage batteries.

Storage batteries, such as lead acid storage batteries of the type used in the automotive and standby power industries, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. of Willowbrook, Ill. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; and U.S. Pat. No. 5,140,269, issued Aug. 18, 1992, to Champlin, entitled ELECTRONIC TESTER FOR ASSESSING BATTERY/CELL CAPACITY.

In some installations, such as for use in backup power supplies or in certain types of automotive vehicles, multiple storage batteries are connected together to form a bank of storage batteries. These batteries can be connected in series, parallel or in a combination of series and parallel connections. Performing an electrical battery test on a battery in such a bank of batteries can be difficult due to the various electrical paths through the series and/or parallel connections of batteries which form the bank of batteries. A single bad battery can be masked by the other good batteries which make up the band of batteries. This has frequently made it difficult to accurately identify a bad battery without electrically disconnecting the batteries prior to performing a battery test.

SUMMARY OF THE INVENTION

An apparatus is provided for testing a first storage battery in a bank of storage batteries, the bank formed of at least two storage batteries electrically coupled together. The apparatus includes a first Kelvin connection configured to couple to the bank of storage batteries, the first Kelvin connection including a first and second electrical connection and a second Kelvin connection configured to couple to the bank of storage batteries, the second Kelvin connection including a first and a second electrical connection, the first and second Kelvin connections configured to couple across at least the first battery. A time varying forcing function source is configured to apply a forcing function between the first electrical connection of the first Kelvin connection and the first electrical connection of the second Kelvin connection. A voltage sensor is configured to sense a voltage between the second electrical connection of the first Kelvin connection and the second electrical connection of the second Kelvin connection and provide a sensed voltage output which is at least partially a function of the forcing function. A current sensor senses an electrical current in the bank of storage batteries related to the first battery and provides a sensed current output which is at least partially a function of the forcing function. A microprocessor determines a condition of the first battery as a function of the sensed voltage and the sensed current.

DETAILED DESCRIPTION OF THE ILLUSTRATIVE EMBODIMENTS

The present invention provides an apparatus for testing storage batteries which are electrically connected in a configuration with other batteries to make up a bank of storage batteries. In many battery installations such as Telcos, (telephone companies), a cost-effective battery system management is high priority. While a regular battery management program will ultimately reduce down time, improve customer service and system quality, programs to add capital equipment can only be justified if a reduction in costs can be expected through improved priority management or because of added value associated with more reliable service. There is an ongoing search for more cost effective-solutions which will help to optimize the management of battery replacement.

Figure 1:
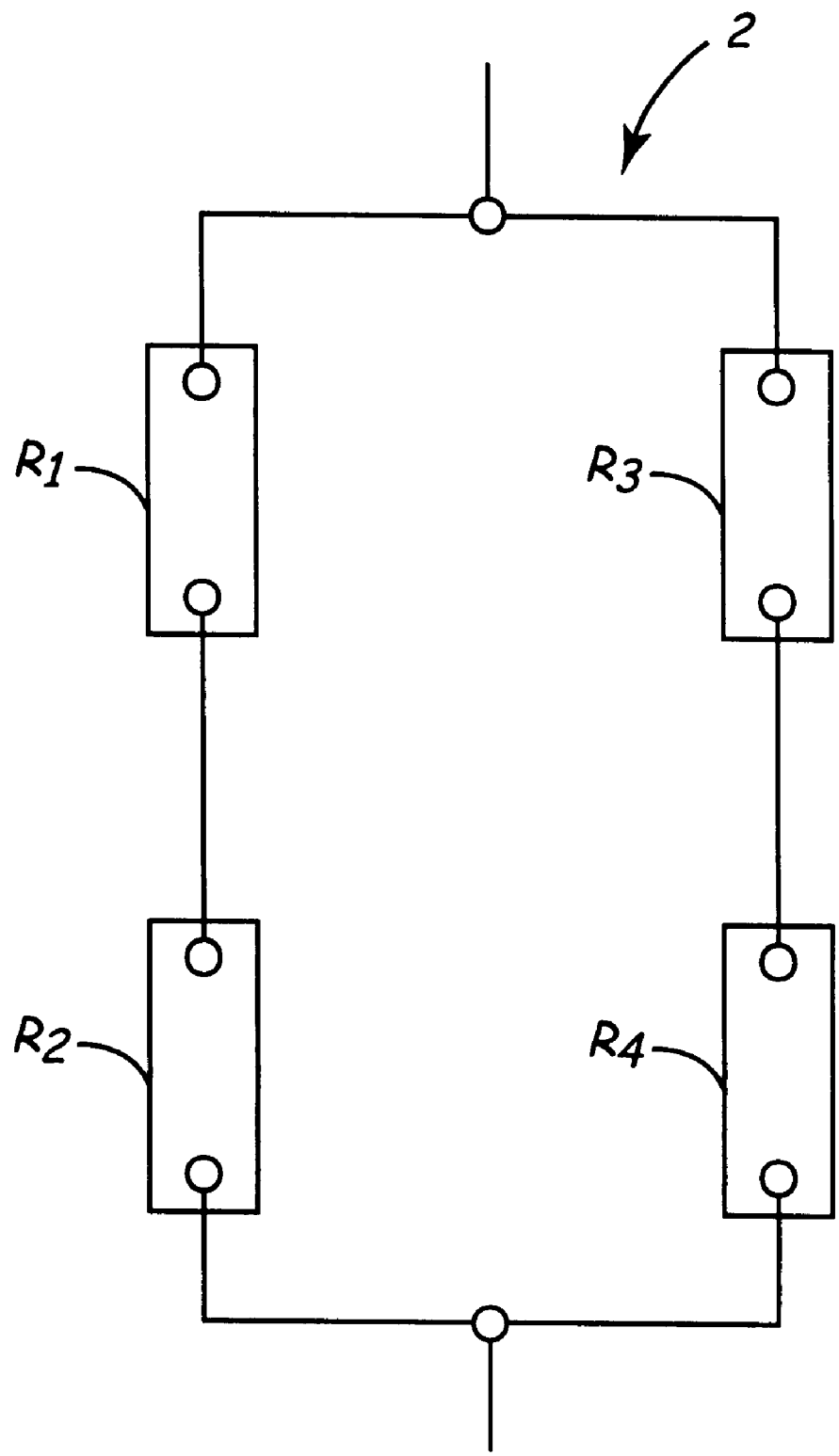
FIG. 1 is a block diagram showing one example battery bank configuration.

FIG. 1 is a diagram of a battery bank 2 formed of 4 batteries represented as resistances $R_1$, $R_2$, $R_3$ and $R_4$. As illustrated in FIG. 1, battery bank 2 is made of 2 series pairs, $R_1$–$R_2$ and $R_3$–$R_4$ connected in parallel. If a measurement of a dynamic parameter is made across one of the batteries, the other batteries in bank 12 will affect the measurement. For example, if a parameter such as dynamic resistance is measured across battery bank 2, each of the resistance $R_1$–$R_4$ will contribute to the measurement as follows:

$$\frac{1}{1/(R_1+R_2)+1/(R_3+R_4)} \qquad \text{Eq. 1}$$

Figure 2:
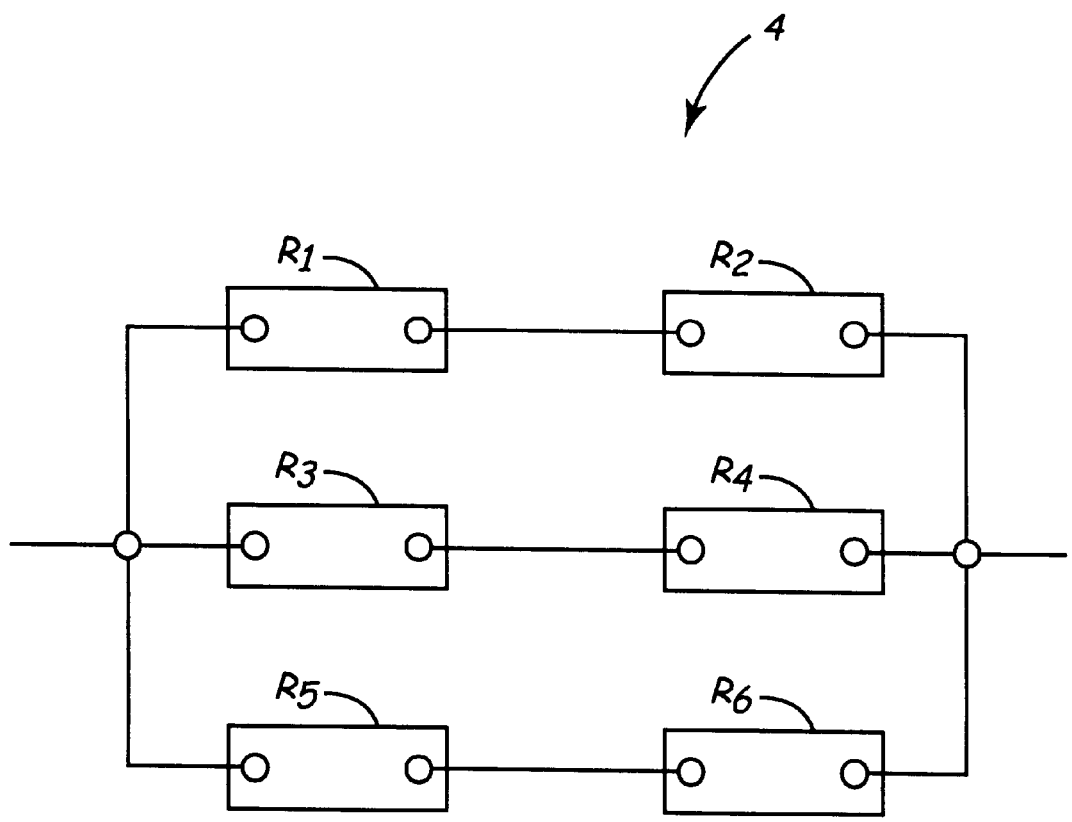
FIG. 2 is a block diagram showing another example batter bank configuration.

A single battery within bank 2 will be masked when measuring across the bank 2. In the past, it has been necessary to disconnect the batteries to obtain accurate individual test results. However, in many installations disconnecting the batteries to perform a test is not practical and may require a critical system to be taken off time. Further, such disconnection is time consuming and can also be a source of a future battery malfunction if the batteries are not reconnected in the correct manner. FIG. 2 is a simplified block diagram showing a battery bank 4 having three serial strings of batteries connected in parallel. The batteries are labelled $R_1$–$R_6$. Of course, a bank of battery can have any configuration and those set forth herein are for illustration purposes only.

The present invention provides a method and apparatus for determining a parameter (such as a dynamic parameter) of an individual battery, or group of batteries, within a bank of batteries. Such banks are commonly used in backup power supplies and in some types of vehicles, such as trucks. The present invention utilizes multiple connections to the battery bank in order to obtain multiple parameters of the bank. Using these measurements, equations can be solved based upon the particular topology of the battery bank in order to determine parameters for individual batteries or groups of batteries within the bank.

The present invention includes an apparatus for testing batteries having first and second Kelvin connections for connecting across at least one battery in the battery bank. In addition, a current sensor is provided for coupling to an inter-cell connection (the connections which span between batteries within the bank of batteries). One connection in each of the two Kelvin connections is used for applying a forcing function. The second connection are used for sensing a voltage between the Kelvin connections. A dynamic parameter of the battery can be determined as a function of the voltage between the Kelvin connections and the current sensed by the current sensor. The dynamic parameter can be any parameter of the battery which is a function of a time varying signal such as dynamic conductance, resistance, admittance, impedance or any of the their combinations. The use of the current sensor in the measurement allows the dynamic parameter to be accurately determined despite any parallel combinations of batteries within the battery bank. The current sensor is capable of sensing an isolated current, that is a current which only flows through the relevant section of the parallel combination of batteries.

Figure 3:
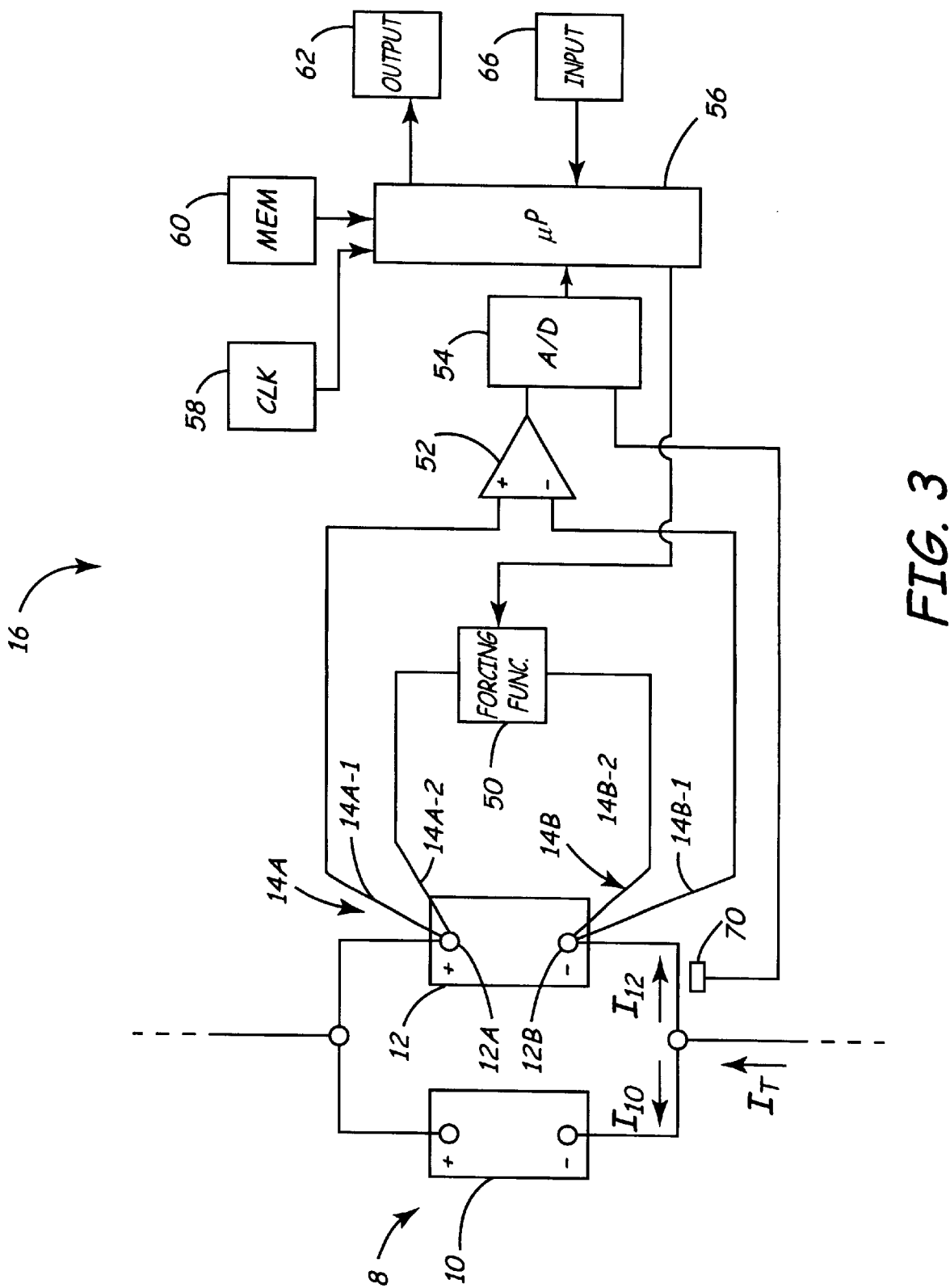
FIG. 3 is a simplified electrical diagram of a battery test apparatus in accordance with one aspect of the invention.

FIG. 3 is a simplified block diagram illustrating one example embodiment of the present invention for measuring a condition of a battery 12 in a battery bank 8. Bank 8 is illustrated as two batteries, storage battery 10 and storage battery 12, connected in parallel. A battery testing apparatus 16, in accordance with one embodiment of the invention, is shown coupled to bank 8. Kelvin connections 14A and 14B are used to couple to terminals 12A and 12B, respectively, of battery 12. Kelvin connection 14A includes two individual connections 14A-1 and 14A-2. Similarly, Kelvin connection 14B includes two individual connections, 14B-1 and 14B-2.

Circuitry 16 operates in accordance with one embodiment of the invention and determines a dynamic parameter of battery 12 in bank 8. Circuitry 16 includes a forcing function 50 and a differential amplifier 52. Forcing function 50 is connected to connections 14A-2 and 14B-2 of Kelvin connections 14A and 14B, respectively. Differential amplifier 52 is connected to connection 14A-1 and connection 14B-1 of Kelvin connections 14A and 14B, respectively. An output from differential amplifier 52 is provided to analog to digital converter 54 which itself provides a digitized output to microprocessor 56. Microprocessor 56 is connected to a system clock 58, a memory 60, and analog to digital converter 54. Microprocessor 56 is also capable of receiving an input from an input device 62 and providing an output on output device 68. The input can be a rating for the battery 10 or describe the topology of bank 8 or the placement of the Kelvin probes and current sensor on bank 8. Input device 66 can comprise any or multiple types of input devices. The result of a battery test, either qualitative or quantitative, can be an output device 68. Device 68 can be a display or other output. A current sensor 70 also connects to microprocessor 56 through analog to digital converter 54. Current sensor 70 is positioned to sense a current $I_{12}$ flowing through battery 12. The total current, $I_T$ flowing through batter bank 8 is equal to the sum of $I_{10}$, the current through battery 10 and $I_{12}$. Sensor 70 can be any type of current sensor including a current shunt, a Hall effect sensor, an inductive clamp, etc. The invention can operate with any technique for determining a voltage across battery 12 and a current through battery 12 and is not limited to the specific techniques set forth herein. The forcing function 50 can be any signal having a time varying component, including a stepped pulse or a periodic signal, having any shape, applied to battery 12. The forcing function can be an active source in which the forcing function signal is injected into battery 12, or can be a passive source, such as a load, which is switched on under the control of microprocessor 56. Additionally, power supply circuitry (not shown) can be used to power battery tester 16 using power derived from battery 12, or from a separate power source.

In operation, microprocessor 56 can receive an input through input 66, such as a rating for battery 12. Microprocessor 56 determines a dynamic parameter, such as dynamic conductance, of battery 12 as a function of the sensed voltage as measured by differential amplifier 52 and the sensed current $I_{12}$ as measured by current sensor 50. The change in these measured values is used to determine the dynamic parameter. For example, the dynamic conductance ($\Delta G$) is determined as:

$$\Delta G = \Delta I_{12}/\Delta V \qquad \text{EQ. 2}$$

The dynamic parameter can be correlated to a condition of the battery which can be used as a basis for comparison of the battery against a battery rating. Such techniques are generally taught and discussed in various patents by Dr.

Champlin and Midtronics, Inc. including: U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; and U.S. Pat. No. 6,051,976, issued Apr. 18, 2000, entitled METHOD AND APPARATUS FOR AUDITING A BATTERY TEST which are incorporated herein by reference in their entirety.

The present invention provides a technique for measuring an isolated value of the change in current through an individual battery or batteries, within a bank of batteries. Although FIG. 3 illustrates the measurement of a condition of a single battery, battery 12, the Kelvin connections 14A and 14B could be connected across multiple batteries which are in various configurations and the current sensor 70 positioned appropriately. With the present invention, it is possible to isolate a defective battery within a bank of batteries without requiring the individual batteries to be disconnected. Using conventional battery testing techniques, the other batteries within the bank of batteries can mask the faulty battery making it difficult to detect. Because the individual batteries doe not need to be disconnected with the present invention, the present invention provides a technique for more rapidly accessing and isolating a faulty battery. Further, because the individual batteries do not need to be disconnected, the likelihood of human error which could arise if the batteries are reconnected improperly is reduced. The present invention can be useful in determining the condition of a storage battery in any type of battery bank including those which are used in some vehicles, standby power systems, etc. Circuitry 16 can be configured as a stationary or a portable battery tester.

Although the present invention has been described with reference to preferred embodiments, workers skilled in the art will recognize that changes may be made in form and detail without departing from the spirit and scope of the invention. For example, other types of testing techniques and dynamic measurement techniques can be used. In one aspect, any type of parameter can be employed and does not need to be a dynamic parameter or a parameter measured using Kelvin connections. The testing may be implemented using analog circuitry, digital circuitry or their hybrid. Further, multiple circuits can be utilized to determine the dynamic parameters or, a single circuit can be multiplexed (either physically or through a multiplexer) between multiple connections.

What is claimed is:

1. An apparatus for testing a first storage battery in a bank of storage batteries, the bank formed of at least two storage batteries electrically coupled together, the apparatus comprising:

a first Kelvin connection configured to couple to the bank of storage batteries, the first Kelvin connection including a first and second electrical connection;

a second Kelvin connection configured to couple to the bank of storage batteries, the second Kelvin connection including a first and a second electrical connection, the first and second Kelvin connections configured to couple across at least the first battery;

a time varying forcing function source configured to apply a forcing function between the first electrical connection of the first Kelvin connection and the first electrical connection of the second Kelvin connection;

a voltage sensor configured to sense a voltage between the second electrical connection of the first Kelvin connection and the second electrical connection of the second Kelvin connection and provide a sensed voltage output which is at least partially a function of the forcing function;

a current sensor configured to sense an electrical current which flows through an electrical connection in the bank of storage batteries, the sensed current related to the first battery, and responsively provide a sensed current output which is at least partially a function of the forcing function; and a microprocessor configured to determine a condition of the first battery as a function of the sensed voltage and the sensed current.

2. The apparatus of claim 1 wherein the microprocessor determining the condition of the first battery as a further function of the forcing function.

3. The apparatus of claim 1 wherein the condition of the first battery is determined based upon a dynamic parameter of the battery.

4. The apparatus of claim 3 wherein the dynamic parameter comprises dynamic conductance.

5. The apparatus of claim 3 wherein the dynamic parameter comprises dynamic resistance.

6. The apparatus of claim 3 wherein the dynamic parameter comprises dynamic admittance.

7. The apparatus of claim 3 wherein the dynamic parameter comprises dynamic impedance.

8. The apparatus of claim 1 wherein the forcing function comprises a current signal.

9. The apparatus of claim 1 including an input configured to receive a rating related to a rating of the battery bank.

10. The apparatus of claim 1 including an input configured to receive information related to a topology of the battery bank.

11. The apparatus of claim 1 wherein the current sensor comprises an inductive probe.

12. The apparatus of claim 1 wherein the current sensor comprises a current shunt.

13. The apparatus of claim 1 wherein the current sensor comprises a Hall effect sensor.

14. The apparatus of claim 9 wherein the rating comprises rated cold cranking amps.

15. The apparatus of claim 1 wherein the forcing function source comprises a switched load.

16. The apparatus of claim 1 wherein the apparatus is powered by the first storage battery.

17. A method for testing a first storage battery in a bank of storage batteries, the bank formed of at least two storage batteries electrically coupled together, the method comprising:

coupling a first Kelvin connection to the bank of storage batteries whereby first and second electrical connections of the first Kelvin connection coupled to the bank of storage batteries;

coupling a second Kelvin connection to the bank of storage batteries, including coupling first and second electrical connections of the second Kelvin connection to the bank of storage batteries, the first and second Kelvin connections configured to couple across at least the first battery;

applying a time varying forcing function between the first electrical connection of the first Kelvin connection and the first electrical connection of the second Kelvin connection;

measuring a response to the forcing function using the second electrical connection of the first Kelvin connection and the second electrical connection of the second Kelvin connection;

sensing a current flowing through an electrical connection in the bank of storage batteries, the sensed current related to a current through the first storage battery and through the bank of storage batteries and at least partially a function of the forcing function; and determining a condition of the first battery as a function of the sensed voltage and the sensed current.

18. The method of claim 17 wherein determining a condition of the first storage battery is further a function of the forcing function.

19. The method of claim 17 wherein determining a condition of the first storage battery includes determining a dynamic parameter of the first storage battery.

20. The method of claim 19 wherein the dynamic parameter comprises dynamic conductance.

21. The method of claim 19 wherein the dynamic parameter comprises dynamic resistance.

22. The method of claim 19 wherein the dynamic parameter comprises dynamic admittance.

23. The method of claim 19 wherein the dynamic parameter comprises dynamic impedance.

24. The method of claim 17 wherein applying a forcing function comprises applying a current signal.

25. The method of claim 17 wherein applying a forcing function comprises applying a resistive load.

26. The method of claim 17 including receiving an input related to a rating of the first battery.

27. The method of claim 17 including receiving an input related to a topology of the battery bank.

28. The method of claim 17 wherein sensing a current includes applying an inductive current probe to the battery bank.

29. The method of claim 17 wherein sensing a current includes applying a current shunt to the battery bank.

30. The method of claim 17 wherein sensing a current includes applying a Hall effect sensor to the battery bank.

31. The method of claim 17 including towering a testing apparatus used to perform the method through power received from the first storage battery.

32. A testing device configured to operate in accordance with the method of claim 17.

* * * * *

UNITED STATES PATENT AND TRADEMARK OFFICE
CERTIFICATE OF CORRECTION

PATENT NO. : 6,316,914 B1
DATED : November 13, 2001
INVENTOR(S) : Bertness

It is certified that error appears in the above-identified patent and that said Letters Patent is hereby corrected as shown below:

Column 7,
Line 34, after "connection" insert -- are --.

Column 8,
Line 42, replace "towering" with -- powering --.

Signed and Sealed this

Twenty-third Day of July, 2002

Attest:

Attesting Officer

JAMES E. ROGAN
Director of the United States Patent and Trademark Office